(12) United States Patent
Hsu et al.

(10) Patent No.: US 6,178,634 B1
(45) Date of Patent: Jan. 30, 2001

(54) MINIATURE RECYCLE-TYPE HEAT EXCHANGE PRODUCTION METHOD

(76) Inventors: Cheng-shen Hsu; Tien-tsai Lin, both of No. 13, Alley 6, Lane 167, Chung Yi Rd., Kuei Shan Hsiang (TW)

(*) Notice: Under 35 U.S.C. 154(b), the term of this patent shall be extended for 0 days.

(21) Appl. No.: 09/287,005

(22) Filed: Apr. 6, 1999

(51) Int. Cl.[7] .................................................. B21D 53/02
(52) U.S. Cl. .............................. 29/890.03; 29/890.049; 29/890.05
(58) Field of Search ..................... 29/890.03, 890.049, 29/890.05

(56) References Cited

U.S. PATENT DOCUMENTS 4,494,288 * 1/1985 Nagai et al. .
5,448,830 * 9/1995 Bochert et al. .

* cited by examiner

Primary Examiner—P. W. Echols
Assistant Examiner—Anthony L. Green
(74) Attorney, Agent, or Firm—Jacobson, Price, Holman & Stern, PLLC (57) ABSTRACT

A miniature recycle-type heat exchanger to produce recycle-type heat exchangers from high extensibility, high plasticity aluminum or copper billets (ingots) utilizing a pressure forming press to extrude lightweight, thin, and small form factor recycle-type heat exchangers. The production method includes annealing copper and aluminum billet (ingot) material, conveying the material to a vibrator for placement in an ordered arrangement, and then conveying and fixing the material onto molds in a pressure forming press for the extrusion tasks required to fabricate the heat exchanger bodies. In the final stage after shaping and determination of the fluid input direction, the bodies are placed in a vacuum sputtering machine to undergo a rough textured heat conductive microparticulate deposition process to complete the production of miniature recycle-type heat exchangers that are of very compact dimensions and lightweight, but have a large heat exchange capacity and, furthermore, a high heat transfer rate.

4 Claims, 7 Drawing Sheets

MINIATURE RECYCLE-TYPE HEAT EXCHANGE PRODUCTION METHOD

BRIEF SUMMARY OF THE INVENTION

The invention herein relates to a miniature recycle-type heat exchanger production method that provides for the production of miniature recycle-type heat exchangers that transfer accumulated heat from a thermally conductive microparticulate medium to a fluid to achieve heat exchange. Suitable for processing at normal temperature, the finished product has the characteristics of difficult oxidation and high purity. The production method utilizes punching and extrusion techniques to fabricate a product having high density and exceptional mechanical strength. The base is vertical with the direction OF punching and extrusion process, and the finished product has three-way heat transfer capability. In the production method, an ultra thin base of 0.2 mm or more and having a plurality of holes are pressure formed in a single operation. The interior surfaces of the product are coated with an excellent heat conduction microparticulate coating that has a very high heat absorption characteristic and, at the same time, can be continuously produced under normal temperature conditions at high output volume and low production cost. Based on the principles of heat transfer enhancement, the product has a greater capacity to transfer heat from surface areas and is advantageous in applications involving extremely thin structures of reduced dimension and weight that require high efficiency heat transfer performance, such as computers, electronics, telecommunications, monitors, and other devices for which a miniature recycle-type heat exchanger production method is suitable.

BACKGROUND OF THE INVENTION

Conventional heat exchangers installed in notebook computers now include extruded aluminum heat exchangers, cast aluminum heat exchangers, and miniature copper tube heat exchangers. As indicated in Table 1, the miniature copper tube heat exchanger has the best heat transfer capability, with a heat transfer coefficient of nearly 10 w/m$^2$ ° C. However, the shortcoming of the said copper tube heat exchanger is that hard welding under very low vacuum conditions is required during the production process, which oxidizes the surface of the finished product and increases manufacturing cost. At the same time, the copper tube heat exchanger tends to radiate large amounts of heat that is readily transferred to the host device, where components are subjected to damaging high temperatures. Furthermore, the copper tube heat exchanger cannot be utilized for three-way heat transfer applications. Having observed such actual situations, the two inventors of the present invention, experienced in the manufacturing aluminum capacitor shells for many years, became aware of that the pressure forming press utilized to extrude aluminum billet into capacitor shells and other similar housings (such as easy-open drink containers) could also be utilized under normal temperature production conditions to fabricate complex shaped products in a single extrusion operation and after fabrication, would be capable of withstanding greater stress due to the resulting increased mechanical strength and also requiring less raw material. Since an ultra thin product having at least a thickness of 0.2 mm can be formed in a single operation, mass production at a fast rate was among the advantages obtained. As a result, research was conducted on a heat transfer invention involving large surface areas with the objective of compelling the entry direction of the air into the product (during convection) and that of higher heat transfer rates as well as the forming of complex shapes in a single punching and extrusion operation to reduce production costs, with accumulated heat to be transferred from a heat conductive microparticulate coating and dissipated in a low temperature fluid to achieve heat exchange. The research culminated in the miniature recycle-type heat exchanger production method of the invention herein.

Table 1 compares the miniature recycle-type heat exchanger produced utilizing the invention herein with that of conventional heat exchangers.

DETAILED DESCRIPTION OF THE INVENTION

Figure 1:
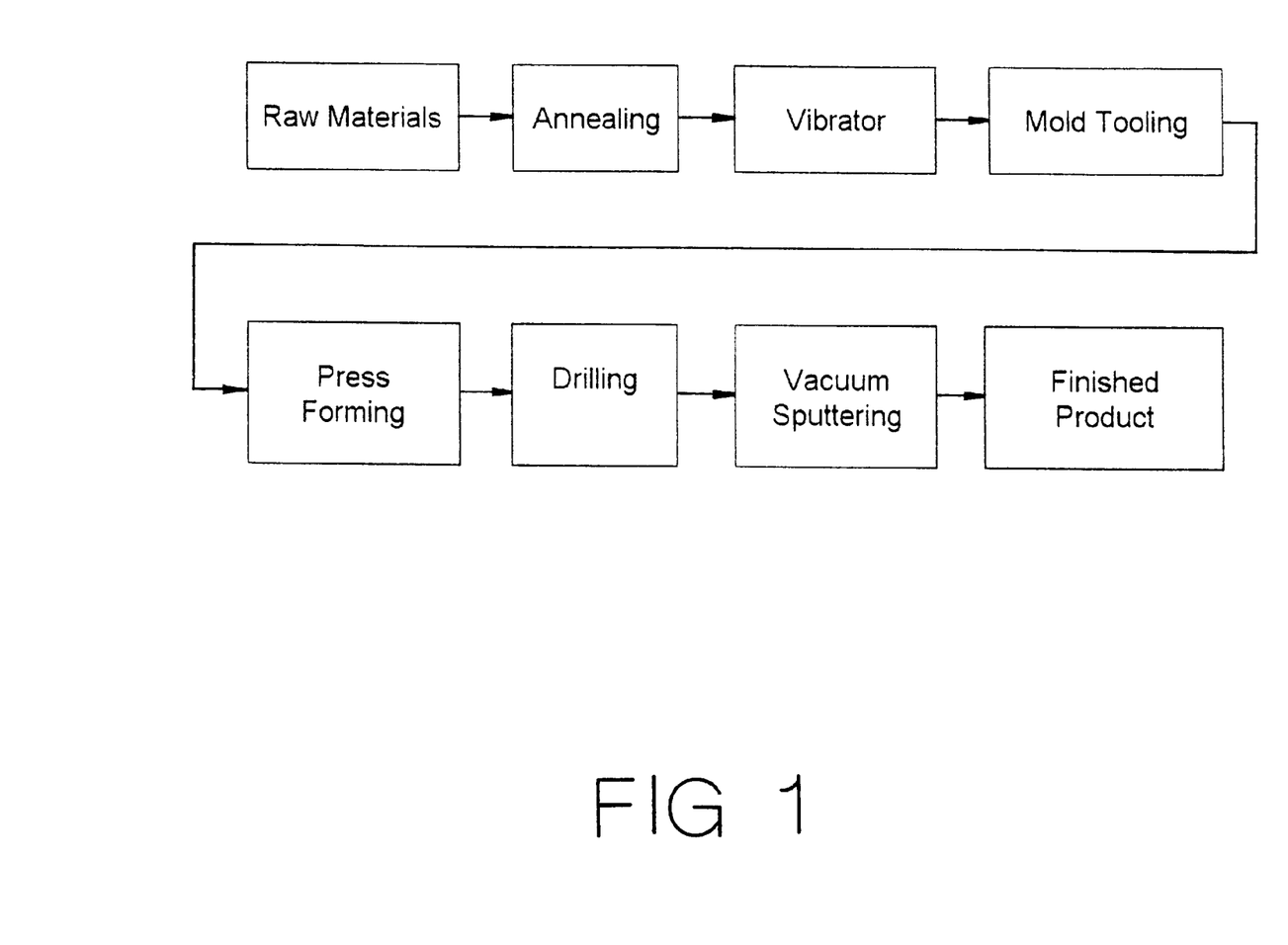
FIG. 1 is a flowchart diagram of the production process.

Referring to FIG. 1, the detailed production method flowchart of the invention herein requires an annealing furnace, a pressure forming press, mold tooling, a drill press, and a vacuum sputtering sputterer and other machines or equipment to execute the production method of the invention herein. Each machine or equipment accomplishes the following processing tasks:

1. Annealing furnace: The first machine in the production process, the annealing furnace affects the material stress of aluminum and copper materials by causing the copper, aluminum, and other non-ferrous metals to be capable of maximum extensibility and plasticity to facilitate the extrusion of the complex contours of the miniature recycle-type heat exchangers of the invention herein.
2. Pressure forming press: Consists of a single mechanical unit that executes later extrusion and pressure forming tasks.
3. Mold tooling: A set of fixing molds utilized for shaping the miniature recycle-type heat exchangers of the invention herein.
4. Drill press: Consists of single unit that bores the holes governing the fluid input direction of miniature recycle-type heat exchangers of the invention herein.
5. Vacuum sputtering machine: A single unit utilizing vacuum principles to sputter by heat conduction fine particle depositions of diamond coating (PLD), boric oxide (BN), aluminum oxide (LAN), pulverized silver (A), and copper (Cu) onto the miniature recycle-type heat exchangers of the invention herein and the heat exchanger passages inside the miniature recycle-type heat exchangers of the invention herein.
6. Vibrator: A machine utilizing vibration principles to automatically arrange and convey components.

Figure 2:
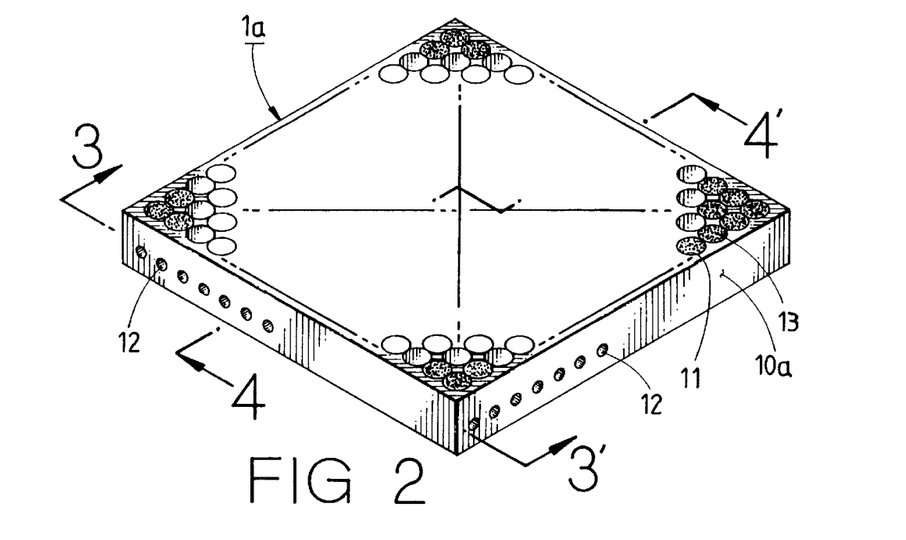
FIG. 2 is an isometric drawing of the first type of the miniature recycle-type heat exchanger of the invention herein.
Figure 4:
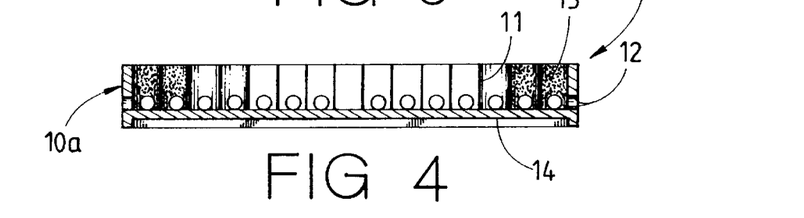
FIG. 4 is a vertical-sectional drawing of the invention herein as viewed from the perspective of line 4-4' in FIG. 3.
Figures 5, 6:
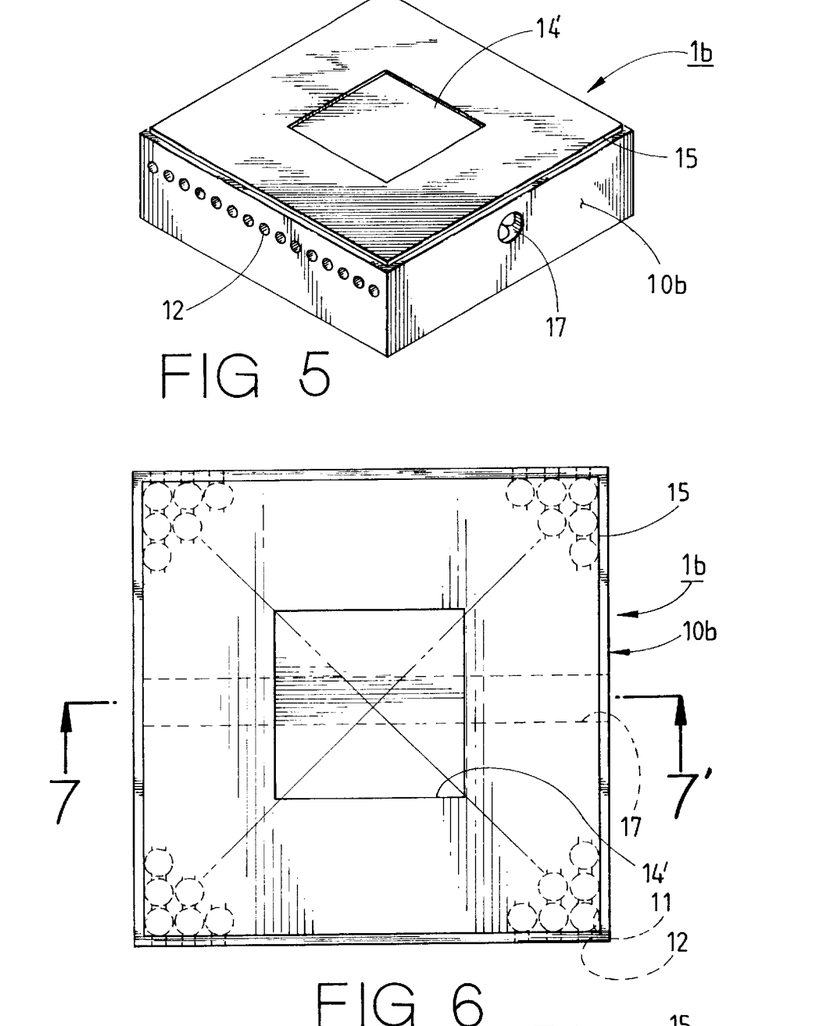
FIG. 5 is an isometric drawing of the second type of miniature recycle-type heat exchanger of the invention herein.
FIG. 6 is an orthographic drawing of the second type of miniature recycle-type heat exchanger of the invention herein.
Figure 7:
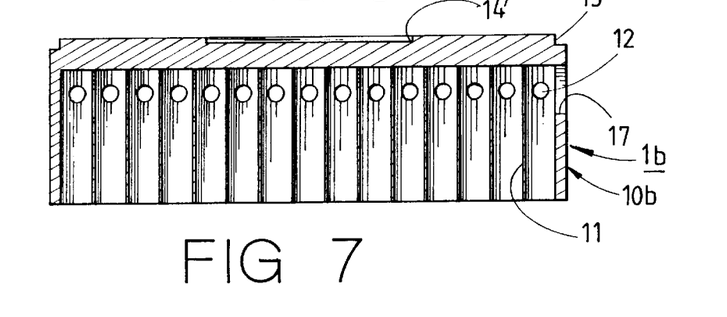
FIG. 7 is a vertical-sectional drawing of the invention herein as viewed from the perspective of line 7-7' in FIG. 6.
Figure 8:
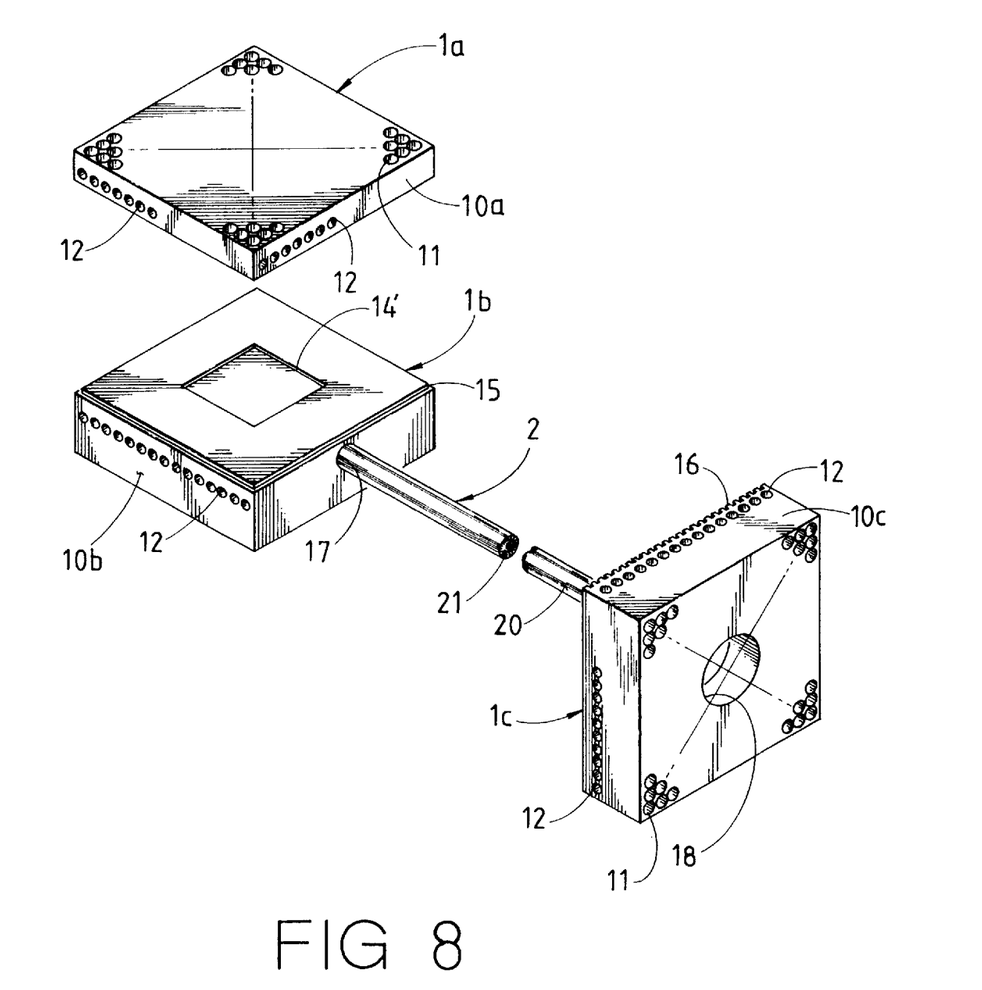
FIG. 8 is an isometric drawing of three different types of miniature recycle-type heat exchanger of the invention herein as configured into a heat exchanger system for a computer or computer product.

The machines and equipment are necessary for the miniature recycle-type heat exchanger production method of the invention herein and, furthermore, complete the production process in a particular order, as indicated in FIG. 1, with the details of each stage of the process described below:

1. Pure copper and aluminum billets, which are non-ferrous materials, are conveyed to the annealing furnace and undergo an annealing procedure at a temperature of 300 degrees for one hour.
2. Following completion of the annealing procedure, the copper and aluminum billets are conveyed into the vibrator and physically arranged in preparation for the next stage at rate of 50 to 100 pieces per minute and then conveyed one billet at a time to the pressure forming press molds.
3. The conveyed copper and aluminum billets are placed in the molds of the pressure forming press, fixed into position by the molds, and then extruded into the bodies 10a, 10b and 10c of the miniature recycle-type heat exchangers 1a, 1b and 1c, respectively, with each of the said bodies having numerous columnar depressions 11 in a closely configured pattern of rows (as indicated in FIG. 2, FIG. 5 and FIG. 8).
4. The miniature recycle-type heat exchanger bodies 10a, 10b and 10c are then conveyed to the drill press, where a series of fluid input holes 12 that govern fluid entry direction are respectively drilled into one side or more of the miniature recycle-type heat exchanger bodies 10a, 10b and 10c [as indicated in FIG. 2, FIG. 5 and FIG. 8, but also shown in FIG. 3, FIG. 4, FIG. 6, FIG. 7 and FIG. 10].
5. Finally, now semi-finished products, the miniature recycle-type heat exchangers 1a, 1b and 1c with fluid input holes 12 already drilled in the miniature recycle-type heat exchanger bodies 10a, 10b and 10c are conveyed into the vacuum sputtering machine, where a rough textured heat conductive microparticulate deposition 13 is applied over the entire surface along the interior walls of the numerous columnar depressions 11 (as indicated in FIG. 2 an FIG. 3) as well as the contiguous inner walls of the fluid input holes 12, which completes the production of the miniature recycle-type heat exchangers 1a, 1b and 1c.

Figure 3:
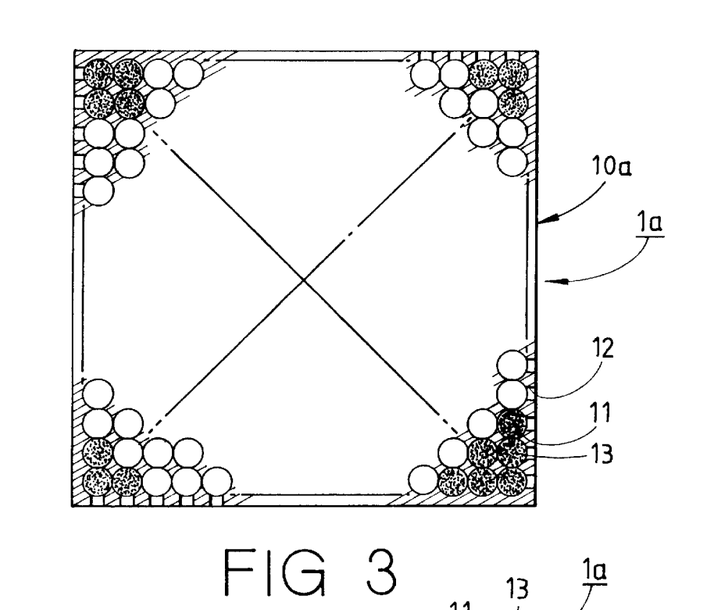
FIG. 3 is a cross-sectional drawing of the invention herein as viewed from the perspective of line 3-3' in FIG. 2.
Figure 9:
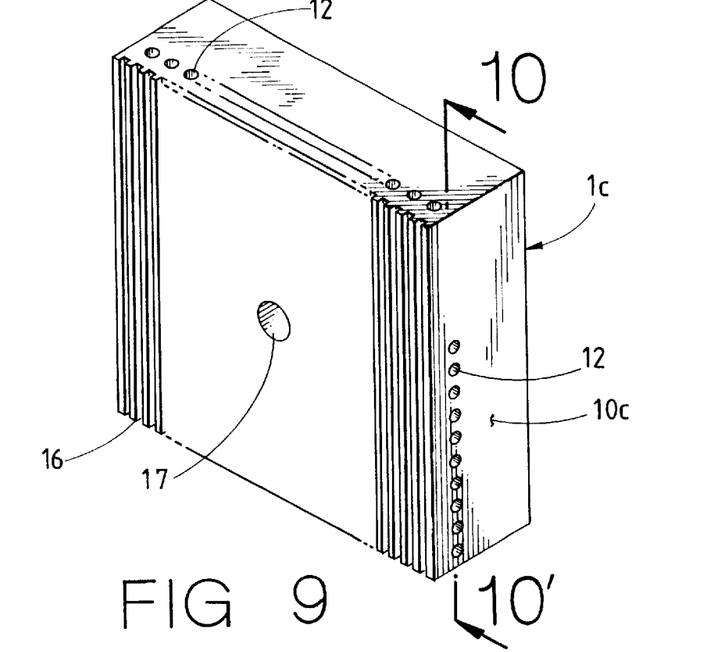
FIG. 9 is an isometric drawing (viewed from the rear) of the third type of miniature recycle-type heat exchanger of the invention herein.
Figure 10:
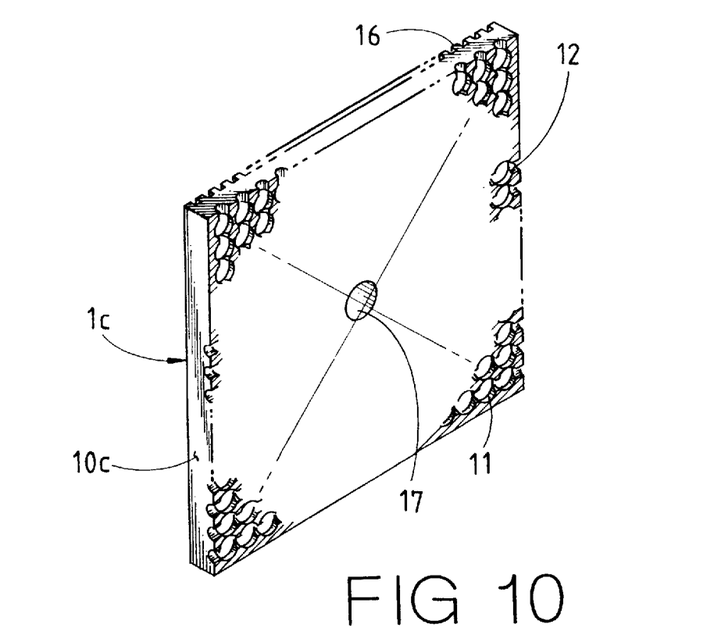
FIG. 10 is a cross-sectional drawing of the invention herein as viewed from the perspective of line 10-10' in FIG. 9.
Figure 11:
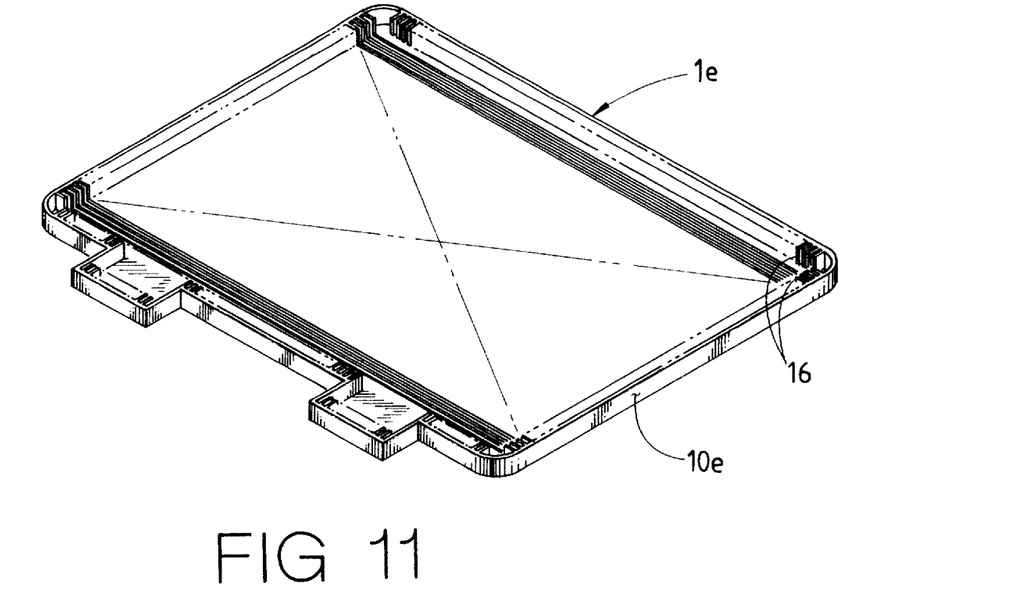
FIG. 11 is an isometric drawing of the front view of a notebook computer display enclosure equipped with a dedicated miniature recycle-type heat exchanger assembled utilizing the production method of the invention herein.
Figure 12:
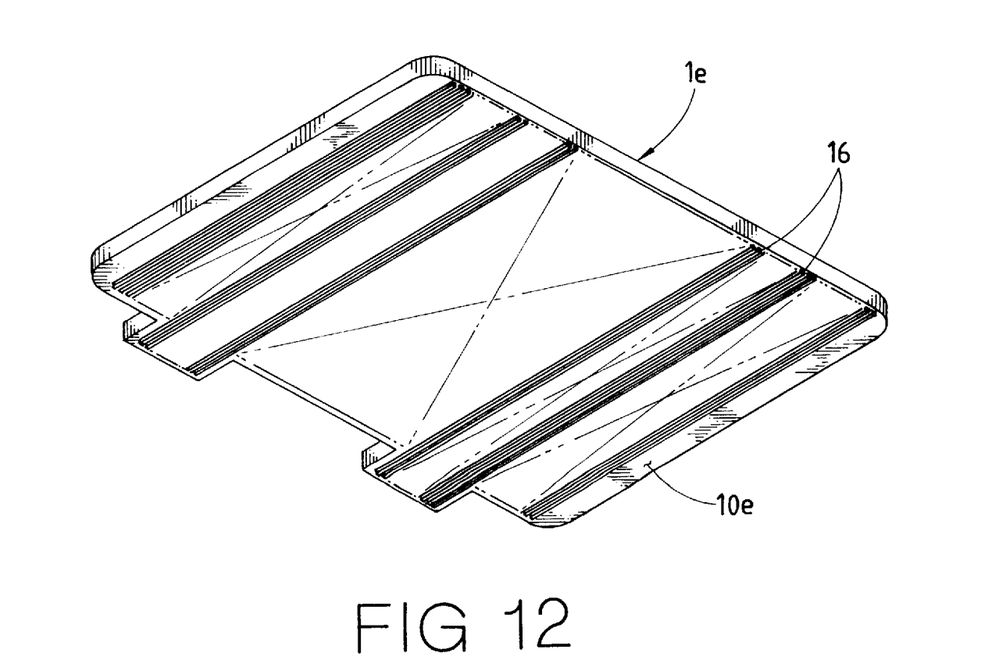
FIG. 12 is an isometric drawing of the rear view of a dedicated miniature recycle-type heat exchanger for notebook computer display enclosures assembled utilizing the production method of the invention herein.
Figure 13:
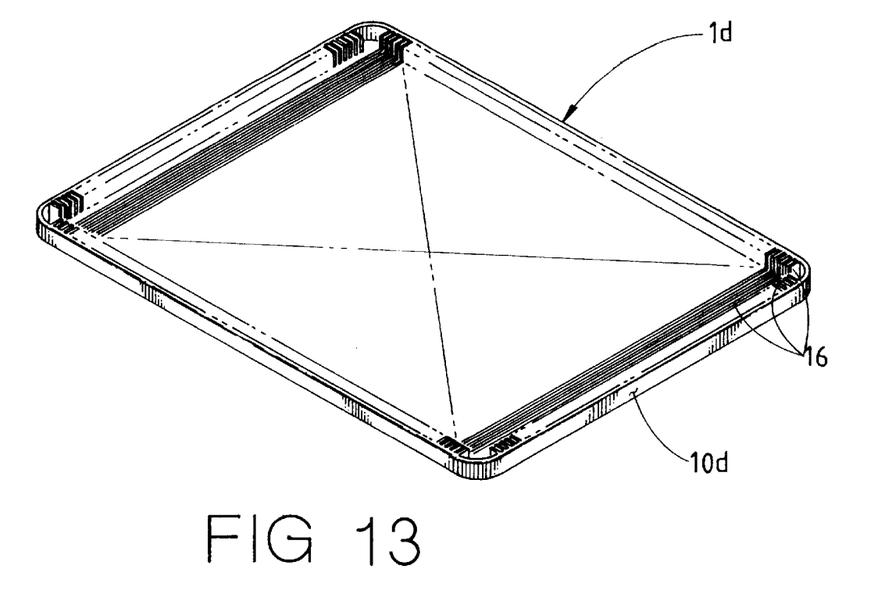
FIG. 13 is an isometric drawing of the front view of a dedicated miniature recycle-type heat exchanger for notebook computer enclosures assembled utilizing the production method of the invention herein.
Figure 14:
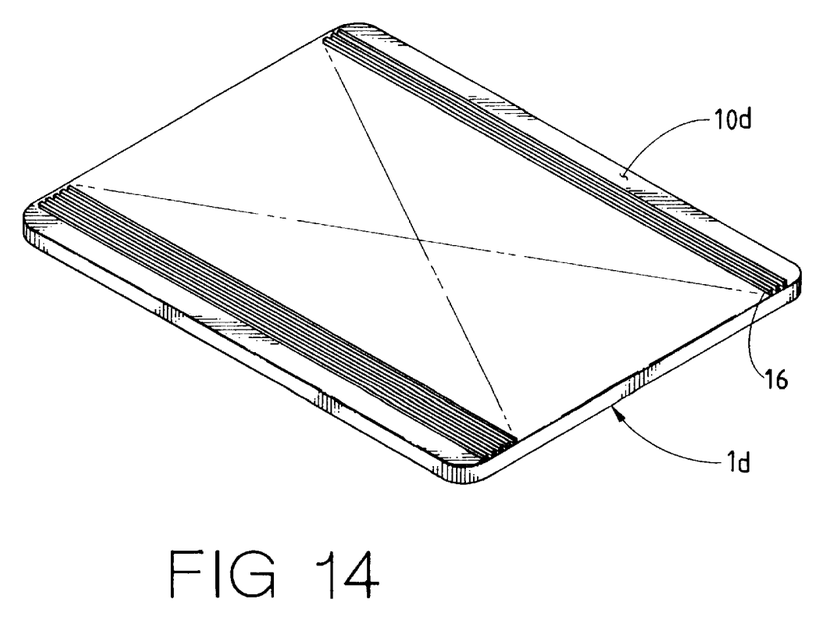
FIG. 14 is an isometric drawing of the rear view of a dedicated miniature recycle-type heat exchanger for notebook computer enclosures assembled utilizing the production method of the invention herein.

Based on the foregoing section, the production method of the invention herein is comprised of a first miniature recycle-type heat exchanger 1a, a second miniature recycle-type heat exchanger 1b, and a third miniature recycle-type heat exchanger 1c. As indicated in FIG. 2, FIG. 3 and FIG. 4, the first miniature recycle-type heat exchanger 1a consists of a body 10a having a relatively shallow recess 14 extruded into the back surface that serves as both a physically integrated bottom mount as well as a heat dissipation direct insertion interface with three-way heat transfer capability for a central processing unit (CPU) or other computer component. As indicated in FIG. 5, FIG. 6 and FIG. 7, the second miniature recycle-type heat exchanger 1b consists of a body 10b having a raised platform 15 with a slightly smaller shallow recess 14' extruded on the back surface that serves as both a physically integrated bottom mount as well as a heat dissipation direct insertion interface for another surface of a CPU or other computer component of the same type or another type. As indicated in FIG. 8, FIG. 9 and FIG. 10, the third miniature recycle-type heat exchanger 1c consists of a body 10c having numerous closely configured, thin projecting heat exchange fins 16 extruded on the back surface, with one or more larger cavity 18 in the front surface for the installation of a cooling exhaust fan (not shown in the drawings) that significantly accelerates heat dissipation.

Referring to FIG. 8, the production method of the invention herein is capable of producing an enhanced heat exchanger system for common larger computers, wherein a miniature recycle-type heat exchange tube 2 is utilized to conjoin the first and second miniature recycle-type heat exchangers 1a and 1b to the third miniature recycle-type heat exchanger 1c; and the tubing body 20 of the miniature recycle-type heat exchange tube 2 is fabricated as a physically integrated unit utilizing the same molding and extrusion method, with the inner walls of the said tubing body 20 having numerous extruded rows of closely configured, thin projecting heat exchange fins 21. One end of the miniature recycle-type heat exchange tube 2 is inserted to the cavity 18 of the aforesaid third miniature recycle-type heat exchanger 1c, and another end of the aforementioned tube 2 is designed for insertion and conjoinment to the hole 17 bored in one side of the body 10b of the second miniature recycle-type heat exchanger 1b.

Referring to FIG. 11, FIG. 12, FIG. 13 and FIG. 14, the production method of the invention herein is capable of producing the case-shaped miniature heat exchangers 1d and 1e which are pressed and extruded, such shapes as similar to a notebook computer main system and display enclosure; the case-shaped miniature heat exchangers 1d and 1e consist of the case-shaped bodies 10e and 10d, respectively, having numerous rows of closely configured, thin projecting heat exchange fins 16 molded and extruded on the entire interior and exterior wall surfaces that replaces conventional molded plastic as well as the more recently introduced cast aluminum-magnesium alloy notebook computer main system and display enclosures, in that the case-shaped miniature heat exchangers 1d and 1e effectively function as both an excellent heat exchanger as well as an enclosure. The production method of the invention herein is capable of extruding heat exchangers that are round, square, rectangular, irregularly contoured, or other profiles, enabling enclosure fabrication applicability to include cellular telephones and palmtop computers.

TABLE 1

| Characteristics | Heat Exchanger Type | | | |
| --- | --- | --- | --- | --- |
| | Extruded Aluminum | Cast Aluminum | Miniature Copper Tube | Miniature Recycle-type |
| Density | Low | Low | High | High |
| Oxide Coating | High | High | High | Low |
| Three-way Heat Transfer | Poor | Good | Bad | Excellent |
| Surface Area | Small | Small | Large | Large |
| Production Cost | Low | High | High | Low |
| Production Volume | Large | Small | Small | Large |
| Wall Thickness | 1.0 mm+ | 1.5 mm+ | 0.5 mm+ | 0.2 mm+ |

What is claimed is:

1. A miniature recycle-type heat exchanger production method, said method comprising the steps of:

annealing copper and aluminum billet (ingot) material, conveying said material to a vibrator for placement in an ordered arrangement, and then conveying and fixing said material onto molds in a pressure forming press for extrusion tasks required to produce round, square, rectangular, or irregularly contoured heat exchanger bodies;

in a final stage, after shaping and determination of a fluid input direction, placing said bodies in a vacuum sputtering machine for application of a rough textured heat conductive microparticulate deposition process over all surface areas that also increases surface strength;

wherein a miniature recycle-type heat exchanger is produced that is of very compact dimensions that is lightweight and has a large heat exchange capacity and a high heat transfer rate.

2. The method claimed in claim 1, wherein said miniature recycle-type heat exchanger includes:

a first miniature recycle-type heat exchanger that includes a body having a relatively shallow recess extruded into a back surface serving as a physically integrated heat dissipation direct insertion interface for a central processing unit (CPU) or other computer component; a second miniature recycle-type heat exchanger that includes a body having a raised platform with a smaller shallow recess extruded on a back surface serving as both a physically integrated bottom mount as well as a heat dissipation direct insertion interface for another surface of a CPU or other computer component, and a third miniature recycle-type heat exchanger that includes a body having numerous closely configured, thin projecting heat exchange fins extruded on a back surface and a cavity in a front surface.

3. The method claimed in Claim 2, wherein said miniature recycle-type heat exchangers include a heat exchanger system for heat dissipation of common computers, wherein a miniature recycle-type heat exchange tube is utilized to conjoin said first and second miniature recycle-type heat exchangers to said third miniature recycle-type heat exchanger; and a tubing body of said miniature recycle-type heat exchange tube is fabricated as a physically integrated unit with inner walls of said tubing body having numerous extruded rows of closely configured, projecting heat exchange fins;

boring a hole in one side of the body of said second miniature recycle-type heat exchanger for insertion of one end of said miniature recycle-type heat exchange tube and boring a hole in one side of the body of said third miniature recycle-type heat exchanger for insertion of the other end of said miniature recycle-type heat exchange tube.

4. The method claimed in claim 1, wherein said miniature recycle-type heat exchangers produced include case-shaped miniature heat exchangers having a same shape as a notebook computer main system and display enclosures as well as cellular telephone and palmtop computer enclosures; said case-shaped miniature heat exchangers include case-shaped bodies having numerous rows of closely configured, projecting heat exchange fins molded and extruded on an entire interior and exterior wall surface.

\* \* \* \* \*